United States Patent
Lill et al.

(10) Patent No.: US 11,656,252 B2
(45) Date of Patent: May 23, 2023

(54) METHOD FOR MEASURING CURRENT AND MEASUREMENT APPARATUS

(71) Applicant: Dr. Ing. h.c. F. Porsche Aktiengesellschaft, Stuttgart (DE)

(72) Inventors: Sven Lill, Lauffen (DE); Harald Schöffler, Bretzfeld-Rappach (DE); Daniel Simon, Ludwigsburg (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 0 days.

(21) Appl. No.: 17/518,720

(22) Filed: Nov. 4, 2021

(65) Prior Publication Data

US 2022/0137105 A1    May 5, 2022

(30) Foreign Application Priority Data

Nov. 5, 2020 (DE) ............ 10 2020 129 127.2

(51) Int. Cl.
*G01R 19/22* (2006.01)
*G01R 19/25* (2006.01)

(52) U.S. Cl.
CPC ............ *G01R 19/22* (2013.01); *G01R 19/25* (2013.01)

(58) Field of Classification Search
CPC ...... G01R 15/09; G01R 15/207; G01R 19/22; G01R 19/25; G01R 35/005; G01R 19/0092; G01R 21/133; G01R 15/202; G01R 21/06; G01R 31/396; G01R 19/2513; G01R 31/3835; G01R 27/28; G01R 31/52; G01R 25/00; G01R 15/247; G01R 21/005; G01R 31/007; G01R 19/2509; G01R 19/0023; G01R 22/063; G01R 31/1272; G01R 31/36; G01R 21/001; G01R 31/50; G01R 31/54; G01R 31/08; G01R 31/67; G01R 33/07; G01R 21/1331; G01R 15/18; G01R 31/58; (Continued)

(56) References Cited

U.S. PATENT DOCUMENTS 4,415,896 A * 11/1983 Allgood .......... H04Q 9/16
340/7.49
5,466,974 A    11/1995 Sutrina et al.
(Continued)

FOREIGN PATENT DOCUMENTS

DE      4140112 A1    6/1993
DE   102008051421 A1    4/2010
(Continued)

OTHER PUBLICATIONS

Great Britain Combined Search and Examination Report for GB Application No. 2115896.9, dated Mar. 21, 2022, 2 pages.

*Primary Examiner* — Vinh P Nguyen
(74) *Attorney, Agent, or Firm* — RatnerPrestia (57) ABSTRACT

A measurement apparatus has a current sensor and at least one A/D converter, which current sensor has at least two channels (CH1, CH2), via which channels (CH1, CH2) the current sensor (30) respectively provides a measurement signal (CH1_SIG, CH2_SIG) characterizing the current. The at least two channels (CH1, CH2) include a first channel (CH1) and a second channel (CH2), which second channel (CH2) is designed to measure a greater maximum current than the first channel (CH1). Also described is a method for measuring a current flowing through a conductor by way of the measurement apparatus.

15 Claims, 6 Drawing Sheets

(58) Field of Classification Search
CPC ......... Y02T 10/70; Y02T 10/90; Y02T 10/92; Y02T 10/72; Y02T 90/167; Y02T 90/16
See application file for complete search history.

(56) References Cited

U.S. PATENT DOCUMENTS

| | | | |
|---|---|---|---|
| 5,543,706 A | | 8/1996 | Rolff |
| 7,164,263 B2* | | 1/2007 | Yakymyshyn ....... G01R 15/207 |
| | | | 324/117 R |
| 9,041,392 B2* | | 5/2015 | Kotera ............... G01R 31/2829 |
| | | | 324/252 |
| 9,322,669 B2* | | 4/2016 | Kagan .................. G05B 23/027 |
| 9,989,618 B2* | | 6/2018 | Spanier ................ G01R 35/005 |
| 10,156,589 B2* | | 12/2018 | Hebiguchi ............. G01R 15/08 |
| 10,545,179 B2 | | 1/2020 | Ausserlechner |
| 2013/0060494 A1 | | 3/2013 | Tsuboi et al. |
| 2014/0218018 A1 | | 8/2014 | Ivanov et al. |
| 2015/0233978 A1 | | 8/2015 | Buffenbarger et al. |
| 2015/0333498 A1 | | 11/2015 | Weeks |
| 2017/0108536 A1 | | 4/2017 | Hebiguchi |
| 2017/0322237 A1 | | 11/2017 | Hanley et al. |

FOREIGN PATENT DOCUMENTS

| | | |
|---|---|---|
| DE | 102015109009 A1 | 12/2016 |
| DE | 102016218049 A1 | 3/2018 |
| EP | 2031412 A2 | 3/2009 |
| KR | 1020190102814 A | 9/2019 |
| WO | 99-0060691 A1 | 10/2000 |
| WO | 2017148823 A1 | 9/2017 |
| WO | 2019016822 A1 | 1/2019 |

\* cited by examiner

METHOD FOR MEASURING CURRENT AND MEASUREMENT APPARATUS

CROSS-REFERENCE TO RELATED APPLICATION

This application claims priority to German Patent Application No. 10 2020 129 127.2, filed Nov. 5, 2020, the content of such application being incorporated by reference herein in its entirety.

FIELD OF THE INVENTION

The invention relates to a method for measuring a current flowing through a conductor and to a measurement apparatus.

BACKGROUND OF THE INVENTION

Current measurements are required in many fields. In the case of electric vehicles and hybrid vehicles, high currents arise and need to be captured in order to determine the electrical power and, on the basis of this, also the motor power. In addition, the level of low currents is also relevant since, for example, the state of charge (SOC) is determined using so-called Coulomb counting in which high and low currents must be captured as accurately as possible since the currents drawn are integrated over time. In racing, maximum currents of up to +/−700 A arise, for example, and Coulomb counting is also carried out at currents of +/−75 A or less.

DE 10 2016 218 049 A1, US 2015/0333 498 A, U.S. Pat. No. 5,466,974 A, US 2014/0218 018 A, WO 2017/148 823 A1, US 2015/0233 978 A, US 2017/0322 237 A, WO 99/60691 A1 and WO 2019/016 822 A1, which are each incorporated herein by reference, disclose different sensors for different fields of application.

SUMMARY OF THE INVENTION

Described herein is a new method for measuring a current flowing through a conductor and a new measurement apparatus.

A measurement apparatus has a current sensor and at least one A/D converter (analog/digital converter), which current sensor has at least two channels, via which channels the current sensor respectively provides a measurement signal characterizing the current, which at least two channels comprise a first channel and a second channel, which second channel is designed to measure a greater maximum current than the first channel.

A method for measuring a current flowing through a conductor by means of such a measurement apparatus has the following steps:

A1) the measurement signal from the first channel is processed in a first signal processing apparatus and a first averaged measurement value is generated, A2) the measurement signal from the second channel is processed in a second signal processing apparatus and a second averaged measurement value is generated, wherein low-pass filtering of the measurement signal is respectively carried out in the first signal processing apparatus and in the second signal processing apparatus, A/D conversion for generating digital individual measurement values is carried out, the individual measurement values are assessed with the formation of a quality criterion, and the individual measurement values are averaged in order to generate an averaged measurement value, B) it is selected in a selection apparatus, on the basis of the respective quality criterion, whether the first averaged measurement value or the second averaged measurement value is used as the selected measurement value.

As a result of the separate processing in the first signal processing apparatus and the second signal processing apparatus, the selection apparatus can make the selection on a data basis of better quality and this results in the selected measurement value having a comparatively low error. The averaging of the individual measurement values makes it possible, on the one hand, to use a lower-resolution A/D converter since the resolution is increased by the averaging and, on the other hand, faster A/D converters can be used and A/D conversions can therefore also be carried out more frequently.

According to one preferred embodiment, the individual measurement values or the averaged measurement values are respectively corrected by means of an associated correction function in the first signal processing apparatus and in the second signal processing apparatus. On the one hand, this correction enables an adjustment, with the result that comparable measurement values are generated for the same current in regions in which both channels can carry out a current conversion. On the other hand, basic inaccuracies of the current sensor in the respective channels can be at least partially reduced.

According to one preferred embodiment, the correction function is in each case dependent on the result of at least one sample measurement which is carried out with the associated channel of the specifically used current sensor. Like during a calibration, sample measurements can be used to determine the extent to which the measurement signals differ from the actual value and this difference can be reduced by means of the correction function. For very accurate correction, a characteristic curve which defines an assignment of the respective individual value or of the averaged measurement value to a current intensity can be respectively used for the correction function.

According to one preferred embodiment, the correction function comprises an offset and scaling. These two mathematical operations make it possible to carry out shifting and scaling and these simple operations already enable good correction.

According to one preferred embodiment, it is selected in the selection apparatus, on the basis of the level of the first averaged measurement value or the level of the second averaged measurement value, whether the first averaged measurement value or the second averaged measurement value is used as the selected measurement value. Since both averaged measurement values indicate a similar current intensity at least in predefined ranges, one of these averaged measurement values can be taken as a basis for determining which one is more suitable.

According to one preferred embodiment, the transition from using the first averaged measurement value as the selected measurement value to using the second averaged measurement value as the selected measurement value takes place at a first limit measurement value, the transition from using the second averaged measurement value as the selected measurement value to using the first averaged measurement value as the selected measurement value takes place at a second limit measurement value, and the first limit measurement value and the second limit measurement value are different in order to cause hysteresis. As a result of such hysteresis, the profile of the selected measurement value fluctuates less in the transition region.

According to one preferred embodiment, the first limit measurement value corresponds to a current of a higher magnitude than the second limit measurement value.

According to one preferred embodiment, the measurement apparatus has a temperature sensor, and the temperature sensor is used to determine a temperature measurement value, and the selected measurement value is changed on the basis of a temperature compensation function dependent on the temperature measurement value in order to reduce an influence of the selected measurement value that is dependent on the present temperature. The temperature influences, in particular, the A/D converter, but the current sensor itself may also be temperature-dependent. The averaged measurement values from all channels can naturally be corrected using an associated temperature compensation function, but this is not absolutely necessary.

According to one preferred embodiment, the measurement apparatus has an output apparatus, and the selected measurement value is output via the output apparatus. The selected measurement value can therefore be made available to other units. This may take place in the push method or the pull method.

According to one preferred embodiment, the output apparatus is designed to output the selected measurement value via a bus system, which bus system is preferably in the form of a CAN bus, LIN bus, CAN-FD, FlexRay or Ethernet with BroadR-Reach. A distribution of the selected measurement value using a bus system also enables use in remote units.

According to one preferred embodiment, when assessing the individual measurement values with the formation of the quality criterion, a check is carried out in order to determine whether the respective individual measurement value is greater, in terms of magnitude, than a predefined maximum value, and exceeding of the maximum value for the quality criterion is deemed to have a quality-reducing effect. Such a check can be used to detect whether the current sensor is operating in an unfavorable limit range or whether there is incorrect connection to a voltage path.

According to one preferred embodiment, when assessing the individual measurement values with the formation of the quality criterion, a check is carried out in order to determine whether the respective individual measurement value is less, in terms of magnitude, than a predefined minimum value, and undershooting of the minimum value for the quality criterion is deemed to have a quality-reducing effect. Current sensors and generally sensors usually operate in a more inaccurate manner during the measurement in the lower range of their measurement range and this can be taken into account.

According to one preferred embodiment, the current sensor is selected from the group consisting of
a direct-measurement current sensor (open-loop transducer), and
a compensation current sensor (closed-loop transducer).

No controlled compensation is carried out in the direct-measurement current sensor and it can operate more quickly as a result. In contrast, compensation by means of a control operation is carried out in the compensation current sensor.

According to one preferred embodiment, the current sensor is designed to measure the magnetic flux density generated by the current to be measured. This makes it possible to indirectly measure the current, during which the current sensor and the conductor are DC-isolated from one another. In the case of such current sensors, the magnetic flux density generated by the current to be measured is measured, in particular in an air gap of a ring which is made of soft-magnetic material (core) and surrounds the conductor having the current to be measured. The ring is used to amplify the magnetic flux density in the region of the air gap. The magnetic flux density is measured, for example, using a Hall sensor, a GMR sensor (GMR=Giant Magneto Resistance) or a TMR sensor (TMR=Tunneling Magnetoresistance). It is also possible to provide a shunt on the conductor and to measure the voltage dropped across the shunt. This measurement is comparatively accurate, but additional heat is produced by the electrical resistance. In addition, the battery internal resistance is increased from the point of view of the entire battery system and this is likewise disadvantageous.

Also described is a means of a measurement apparatus having a current sensor and at least one A/D converter, which current sensor has at least two channels, via which channels the current sensor respectively provides a measurement signal characterizing the current, which at least two channels comprise a first channel and a second channel, which second channel is designed to measure a greater maximum current than the first channel, and which measurement apparatus is designed to carry out a method that is described herein.

BRIEF DESCRIPTION OF THE DRAWING FIGURES

Further details and advantageous developments of the invention emerge from the exemplary embodiments, which are described below and are illustrated in the drawings and should not be understood as meaning a restriction of the invention in any way. It goes without saying that the features mentioned above and the features yet to be explained below can be used not only in the respectively stated combination but also in other combinations or alone without departing from the scope of the present invention. In the drawings.

DETAILED DESCRIPTION OF THE INVENTION

Identical or identically acting parts are provided with the same reference signs below and are usually described only once. The descriptions of all of the figures build on one another in order to avoid unnecessary repetitions.

Figure 1:
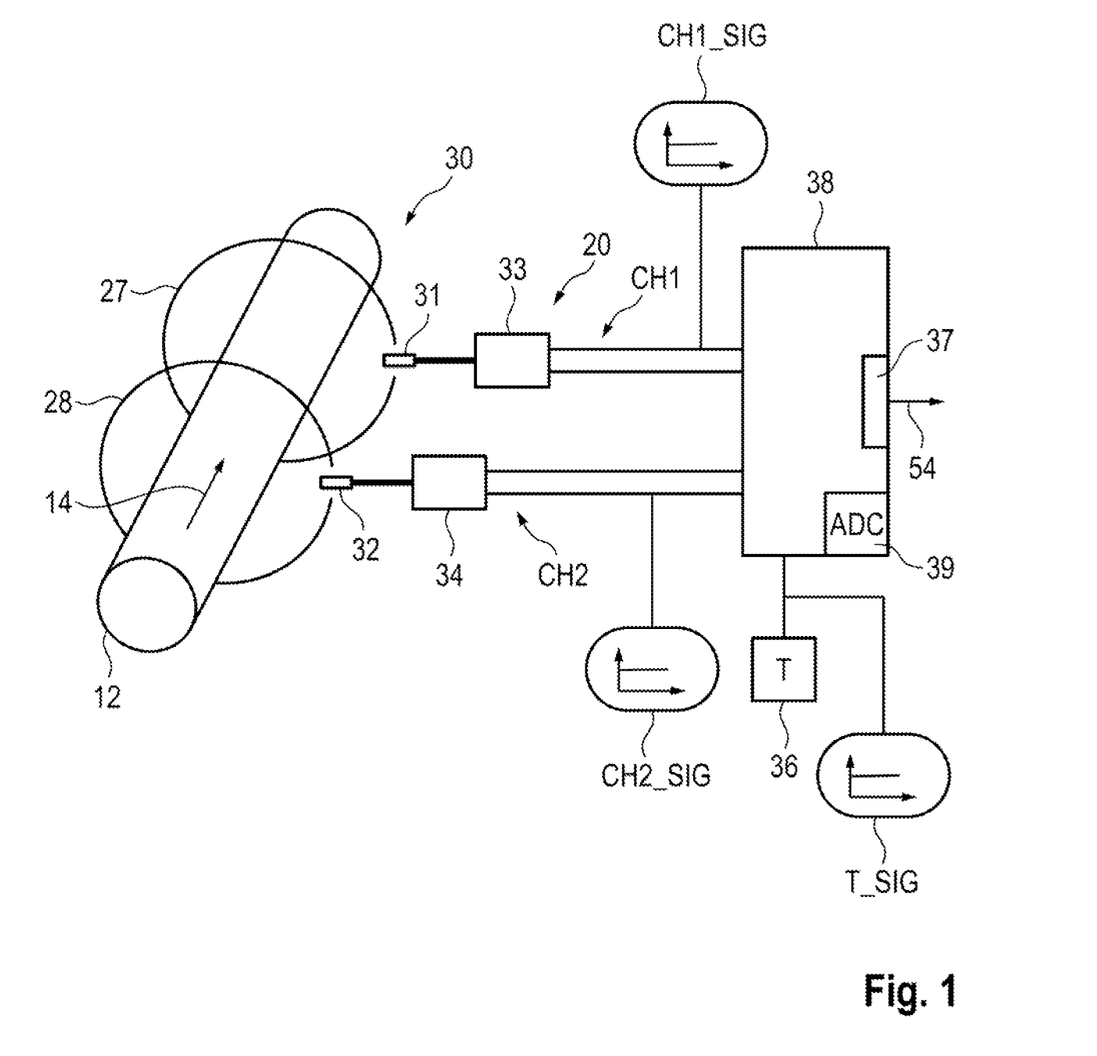
FIG. 1 shows a schematic illustration of an electrical conductor and a measurement apparatus.

FIG. 1 shows a conductor 12 through which a current 14 flows. A measurement apparatus 20 is provided and the measurement apparatus 20 has a current sensor 30, a temperature sensor 36 and an evaluation apparatus 38.

The current sensor 30 is in the form of a DC-isolated current sensor which is therefore not DC-coupled to the conductor 12. It preferably has two magnetically conductive rings 27, 28, and a flux density sensor 31, 32, in particular a Hall sensor, is respectively arranged in interruptions in these magnetically conductive rings 27, 28, which are also referred to as an air gap. The flux density sensors 31, 32 measure the magnetic flux density generated by the current 14 and use it to generate a voltage signal. The current sensor 30 therefore operates as an indirectly measuring current sensor. The voltage signal from the flux density sensor 31 is amplified in an amplification circuit 33, and the voltage signal from the flux density sensor 32 is amplified in an amplification circuit 34. The outputs from the amplification circuits 33 and 34 are referred to as a first channel CH1 and a second channel CH2, and the respective measurement signals CH1_SIG and CH2_SIG characterizing the current 14 are supplied to the evaluation apparatus 38.

It is not necessary to provide two magnetically conductive rings 27, 28, and the flux density sensors 31, 32 may also be provided in the air gap of a single ring 27 and may be optimized for different flux densities.

The evaluation apparatus 38 is assigned the temperature sensor 36 for generating a temperature signal T_SIG and it has an A/D converter ADC 39 and an output apparatus 37, via which output apparatus 37 the evaluation apparatus 38 can output a signal on a line 54.

The temperature sensor 36 is preferably an NTC temperature sensor or a PTC temperature sensor and is preferably arranged in the vicinity of the A/D converter ADC 39 in order to be able to determine the temperature of the A/D converter 39 in a good approximation.

Figure 2:
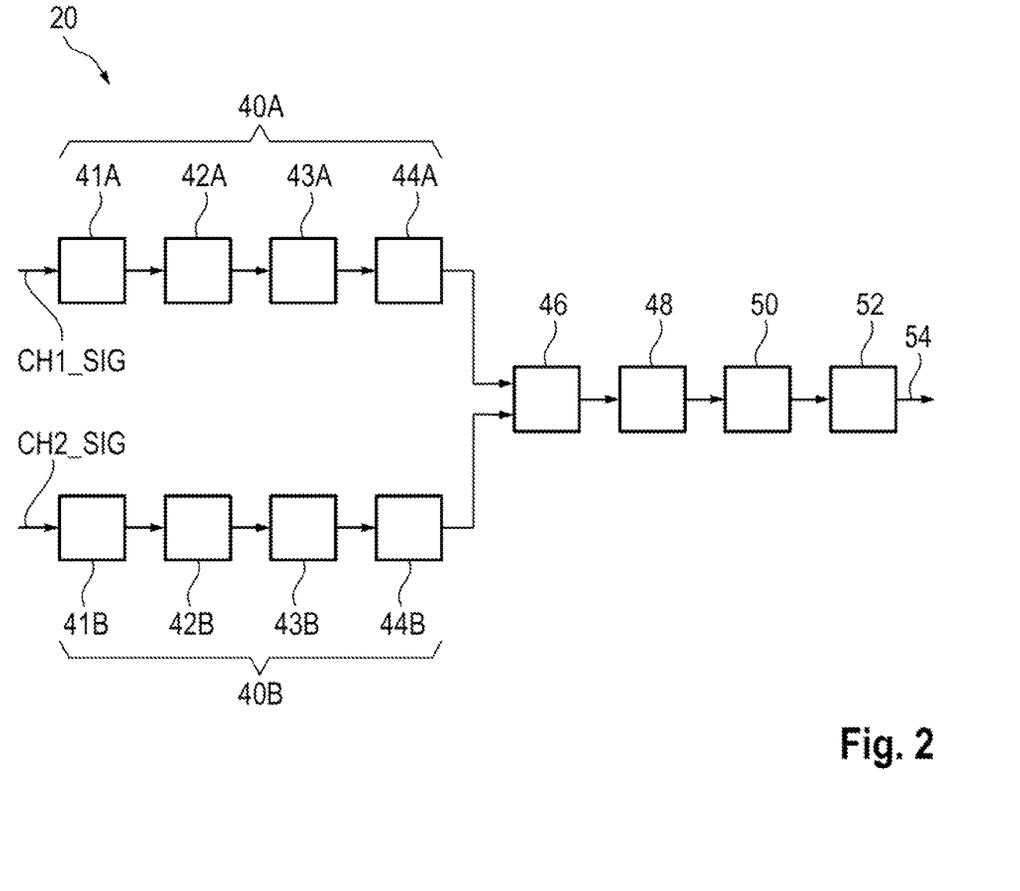
FIG. 2 shows a schematic illustration of the structure of the measurement apparatus.

FIG. 2 shows a schematic illustration of the steps which take place in the measurement apparatus 20 and of the units/modules which are present.

The first measurement signal CH1_SIG from the first channel CH1 is processed in a first signal processing apparatus 40A and the second measurement signal CH2_SIG is processed in a second signal processing apparatus 40B. The first signal processing apparatus 40A has four units 41A, 42A, 43A, 44A.

In the unit 41A, a low-pass filter is applied to the measurement signal CH1_SIG. The low-pass filter is preferably in the form of an analog circuit. The low-pass filter may be, for example, of the second-order Sallen-Key filter type, or a simple first-order low-pass filter can be used. High-frequency oscillations are attenuated by the application of the low-pass filter and this leads to a better result during subsequent A/D conversion in the unit 42A. The low-pass filter acts as an anti-aliasing filter and is advantageous since this makes it possible to comply with the Nyquist-Shannon sampling theorem. The A/D conversion converts the measurement signal CH1_SIG into a corresponding digital individual measurement value CH1_VAL.

In the unit 43A, an averaged measurement value CH1_AVE is calculated from a plurality of measured individual measurement values CH1_VAL and the individual measurement values CH1_VAL are assessed with the formation of a quality criterion.

A correction function f_COR_CH1 is then applied to the averaged measurement value CH1_AVE in the unit 44A. The correction function f_COR_CH1 contains, for example, an offset correction and scaling. The correction function f_COR_CH1 is preferably dependent on at least one sample measurement carried out with the associated channel CH1 of the specifically used current sensor 30. The correction function f_COR_CH1 may also be provided in the form of a characteristic curve.

The resulting averaged measurement value CH1_AVE is supplied to a unit 46.

The second channel CH2 and the second measurement signal CH2_SIG are processed in the same manner in the second signal processing apparatus 40B and the units 41B, 42B, 43B, 44B functionally correspond to the units 41A, 42A, 43A and 44A. The correction function in the unit 44B is referred to as f_COR_CH2.

The unit 46 is a selection apparatus which, on the basis of the respective quality criterion, selects whether the first averaged measurement value CH1_AVE or the second averaged measurement value CH2_AVE is used as the selected measurement value SEL_VAL.

A low-pass filter is then preferably applied in a unit 48 in order to limit the dynamic response of the selected measurement value SEL_VAL. However, the filter in the unit 48 may be dispensed with on the basis of the specific application in the case of a desired high dynamic response.

A temperature-dependent correction of the selected measurement value SEL_VAL is then carried out in the unit 50 by applying a temperature compensation function f_T_COMP, wherein the temperature is present as a measurement value by virtue of the temperature sensor 36 from FIG. 1. During the measurement, the temperature has an effect, in particular, on the A/D converter and this effect can be reduced or compensated for by the unit 50. Other temperature-related effects on the measurement can also be reduced by means of the temperature compensation function f_T_COMP.

The selected measurement value can finally be output in the unit 52, for example via a CAN bus or a LIN bus.

Figure 3:
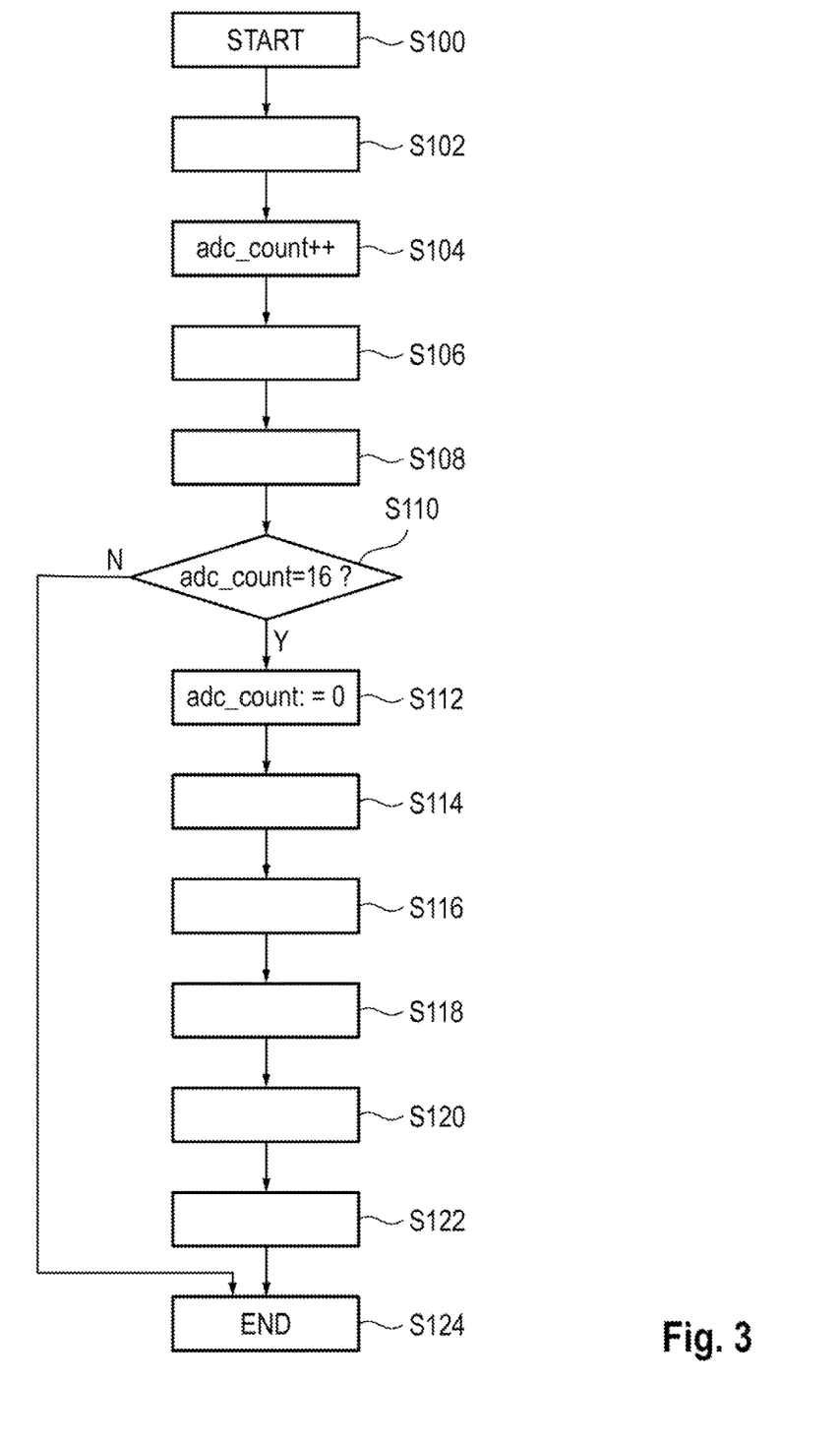
FIG. 3 shows a schematic illustration of a flowchart for a routine of the measurement apparatus.

FIG. 3 shows a flowchart having steps which are each consecutively numbered starting with a letter S and a subsequent number. A routine S100 is called up, for example, at regular intervals by a timer interrupt or by a loop, and there is a jump to S102.

In S102, the A/D converter 39 from FIG. 1 is used to convert the first measurement signal CH1_SIG, to convert the second measurement signal CH2_SIG and to convert the temperature measurement signal T_SIG generated by the temperature sensor 36 from FIG. 1. If there are a plurality of A/D converters 39, the conversions can be carried out in a parallel manner. Alternatively, the A/D conversion can be carried out in succession and, for this purpose, microcontrollers possibly have a multiplexer assigned to the A/D converter.

The corresponding individual measurement values are referred to as CH1_VAL, CH2_VAL and T_VAL.

In S104, a variable adc_count is incremented in order to indicate that a further measurement has taken place.

Figure 4:
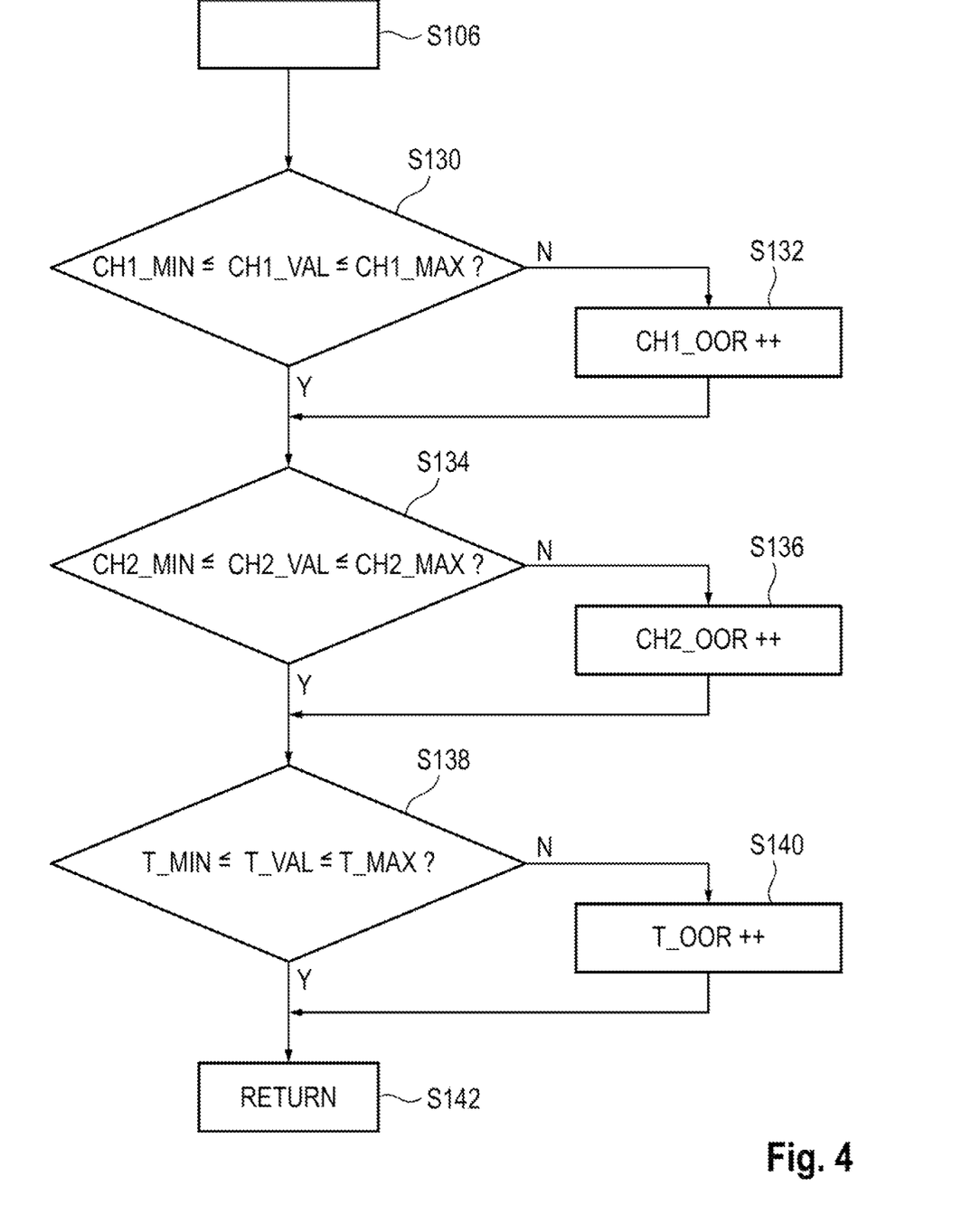
FIG. 4 shows a schematic illustration of a flowchart for determining quality criteria for different measurements.

In S106, the individual measurement values are assessed with the formation of a quality criterion which is referred to, for example, as CH1_OOR, CH2_OOR and T_OOR. An example of the generation of the quality criteria is shown in FIG. 4.

In S108, a sum of the previously determined individual measurement values is formed.

In S110, a check is then carried out in order to determine whether 16 individual measurement values have already been determined. For this purpose, a check is carried out in order to determine whether the variable adc_count has the value 16. In the exemplary embodiment, 16 measurement values are therefore averaged in each case. However, this number may be suitably selected on the basis of the specific exemplary embodiment, for example 8 or 20. If 16 individual measurement values have not yet been determined, there is a jump to S124 and the routine is ended. However, if 16 measurements have been carried out, there is a jump to S112 and the variable adc_count is reset. In step S114, the averaged measurement values CH1_AVE from the first channel and CH2_AVE from the second signal are then provided, by means of a calculation, with an offset suitable for the respective channel and with scaling, that is to say the correction function f_COR_CH1 or f_COR_CH2 described in FIG. 2 is used.

Figure 5:
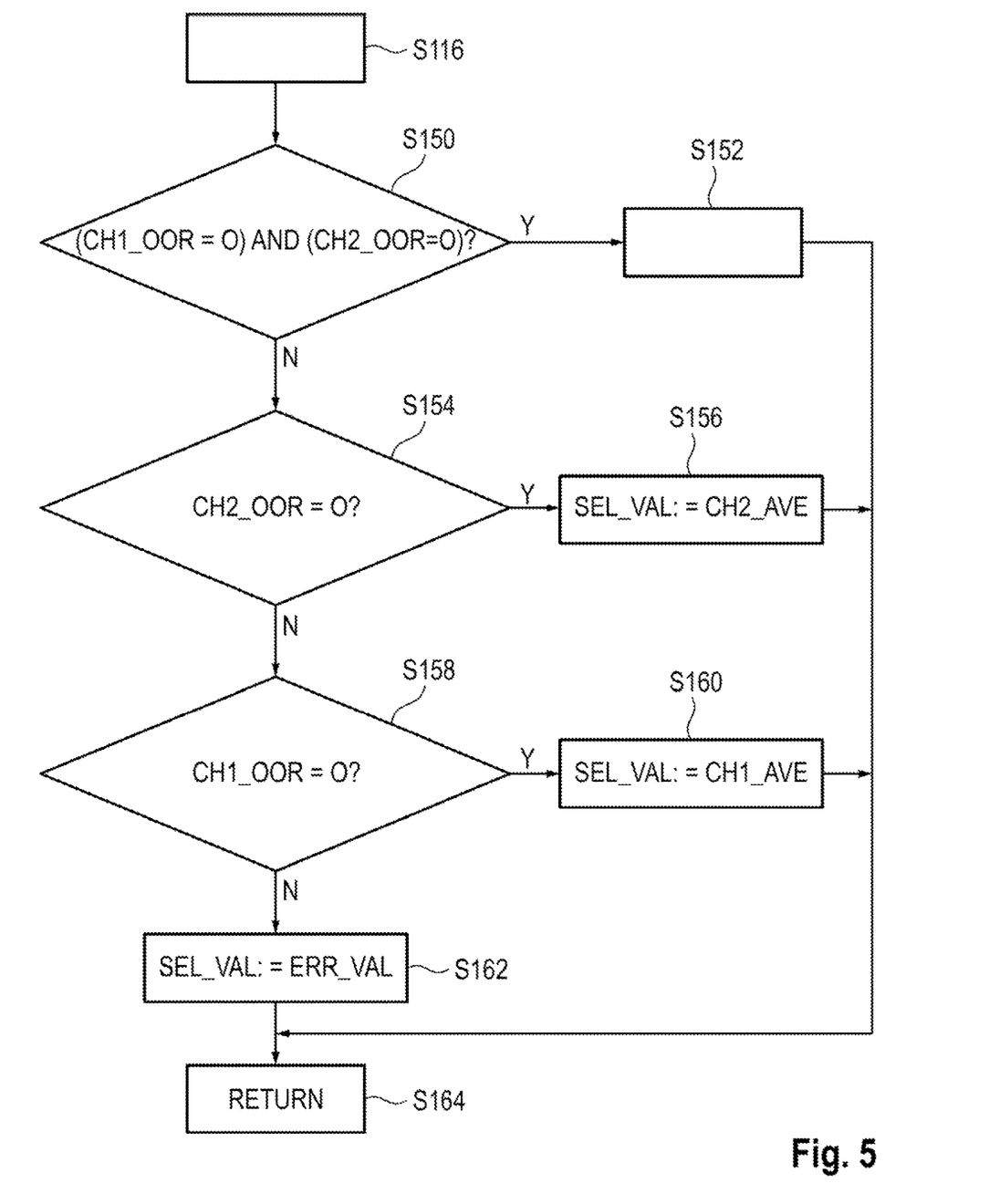
FIG. 5 shows a schematic illustration of a flowchart for selecting a suitable measurement value on the basis of quality criteria.

In S116, that channel which has a higher accuracy or a higher quality is selected. This is carried out on the basis of the quality criteria which were determined on the basis of the individual measurement values. An exemplary embodiment for S116 is shown in FIG. 5.

In S118, a low-pass filter is applied to the selected measurement value SEL_VAL and this corresponds to the unit 48 from FIG. 2.

In S120, the selected measurement value SEL_VAL is output.

In S122, the generation of the subsequent averaged measurement value is then prepared. For this purpose, the quality criteria are reset, in particular, and the variables for the averaging are likewise reset and an item of information relating to the currently selected channel CH1 or CH2 is stored.

The process leaves the routine in S124.

As stated above, the routine S100 is called up at regular intervals, for example at a frequency of 8 kHz or every 125 µs.

FIG. 4 shows an embodiment of step S106 for determining the quality criteria.

In S130, a check is carried out in order to determine whether the individual measurement value CH1_VAL from the first channel CH1 is between a minimum value CH1_MIN and a maximum value CH1_MAX. If this is the case, the measurement is in a suitable range and there is a jump to S134. However, if the individual measurement value CH1_VAL is outside the predefined range, there is a jump to S132 and a quality criterion CH1_OOR is incremented. This indicates that this measurement is in an unsuitable range. There is then a jump to S134. The quality criterion CH1_OOR can therefore be taken as a basis for determining whether one or more of the individual measurement values to be averaged were outside the permissible range. Excessively low measurement values may arise, for example, as a result of a malfunction, during which there is a connection to ground GND, or the current to be measured is too low for the corresponding channel. Excessively high individual measurement values may arise, for example, in the case of an excessively high current intensity or in the case of a defective connection of the current sensor 30 to a positive voltage. The quality criterion CH1_OOR may naturally be determined with finer granularity or it is possible to store, for example, whether the respective values were too low or too high.

For the second channel CH2, step S134 corresponds to step S130 and step S136 corresponds to step S132. The corresponding values are provided for the second channel CH2. The minimum value is called CH2_MIN, the maximum value is called CH2_MAX, the individual measurement value is called CH2_VAL and the quality criterion is called CH2_OOR.

In S138, a corresponding plausibility check is carried out for the temperature measurement value T_VAL and the latter must be in the range T_MIN to T_MAX for it to be considered valid. In S140, a corresponding quality criterion T_OOR can be used for the temperature measurement.

The routine S106 is ended in S142.

FIG. 5 shows an exemplary embodiment for step S116 from FIG. 3, in which an averaged measurement value is selected on the basis of the quality criteria.

Figure 6:
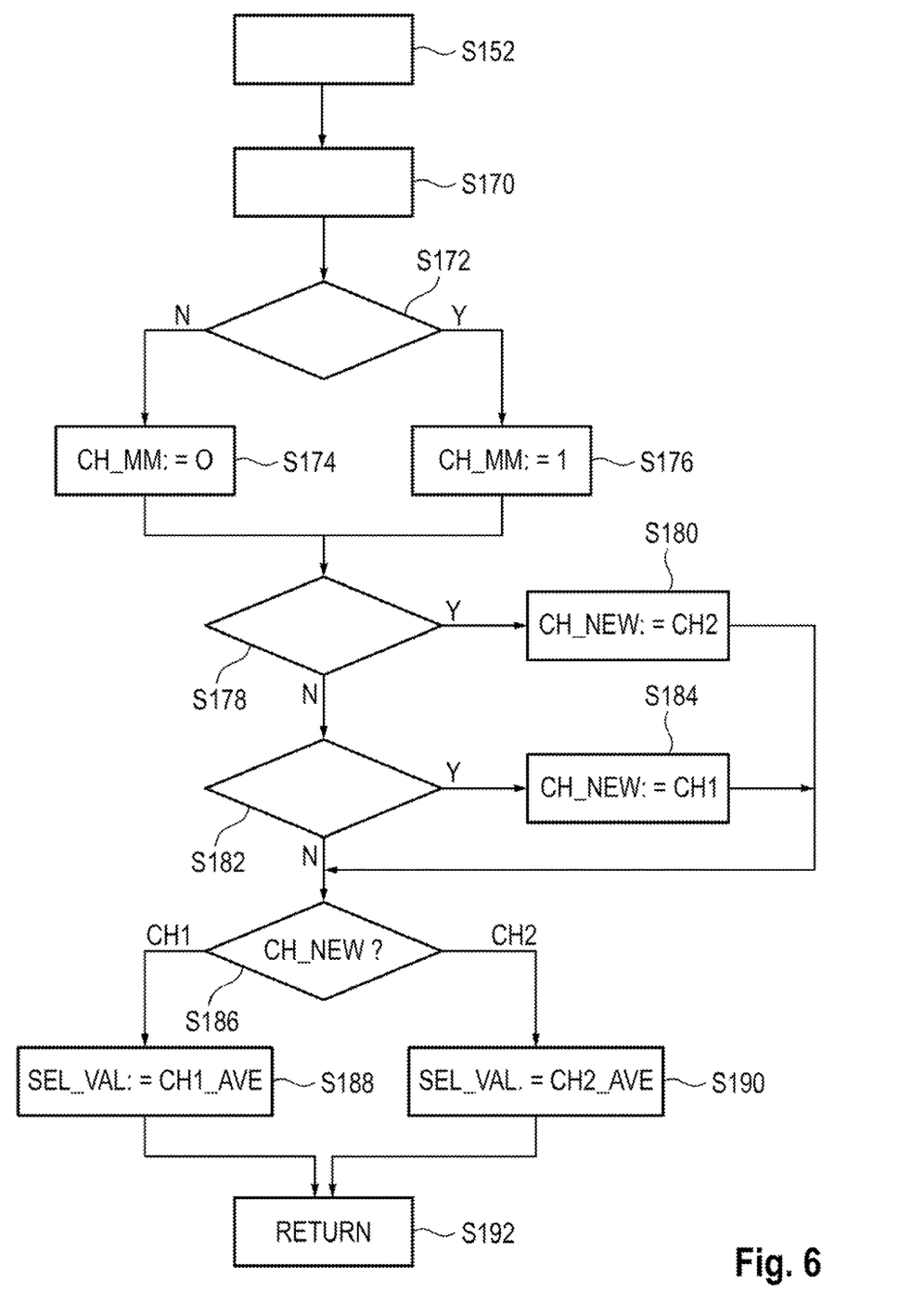
FIG. 6 shows a schematic illustration of a flowchart for a hysteresis function.

In S150, a check is carried out in order to determine whether all individual measurement values CH1_VAL and CH2_VAL were in the respectively predefined range both for the first channel CH1 and for the second channel CH2. If so, a suitable averaged measurement value from the first channel or second channel is selected in S152, as shown in FIG. 6.

If, however, an unsuitable measurement of an individual measurement value CH1_VAL or CH2_VAL is indicated for at least one channel using the associated quality criterion, there is a jump to S154.

In S154, a check is carried out in order to determine whether all individual measurement values CH2_VAL for the second channel CH2 were in a suitable range. If so, the averaged measurement value CH2_AVE from the second channel is selected as the selected measurement value SEL_VAL.

Otherwise, there is a jump to S158 and a check is carried out there in order to determine whether all individual measurement values CH1_VAL from the first channel CH1 were in the predefined range. If so, the averaged measurement value CH1_AVE from the first channel CH1 is selected as the selected measurement value SEL_VAL.

Otherwise, the selected measurement value SEL_VAL is set to an error value ERR_VAL, for example in S162, in order to indicate a corresponding error. Alternatively, that averaged measurement value CH1_AVE or CH2_AVE for which the associated quality criterion CH1_OOR or CH2_OOR is lower can be selected.

From S152, S156, S160 or S162, there is a jump to S164, and the process leaves the routine.

FIG. 6 shows an exemplary embodiment of step S152 from FIG. 5, in which a suitable averaged measurement value is selected provided that the individual measurement values CH1_VAL, CH2_VAL for both channels CH1, CH2 were in the predefined range.

In S170, the difference between the averaged measurement value CH2_AVE and the averaged measurement value CH1_AVE is calculated. This difference indicates, in terms of magnitude, whether there is a relatively large discrepancy between the averaged measurement values CH1_VAL and CH2_VAL.

In S172, a check is carried out in order to determine whether the difference is greater than a difference limit value. If so, there is a jump to S176 and a variable CH_MM, which is set to the value 1, is used to indicate that there is a significant difference (mismatch). If not, the variable CH_MM is set to the value zero in S174. In both cases, there is a jump to S178 and a check is carried out there, on the one hand, in order to determine whether the old selected channel is the first channel and whether the first averaged measurement value CH1_AVE is greater than a first limit measurement value THRESHOLD_HIGH. If this is the case, there is a jump to S180 and the second channel is selected as the new channel CH_NEW. There is a jump to S186.

If not, there is a jump to S182 and a check is carried out there in order to determine whether the previously selected channel is the second channel CH2 and whether the first averaged measurement value CH1_AVE is less than a second limit measurement value THRESHOLD_LOW. If this is the case, there is a jump to S184 and the first channel is selected as the new channel CH_NEW. There is then a jump to S186. If the condition in S182 is not true, there is a direct jump to S186.

In S186, there is a jump to S188 or S190 depending on the variable CH_NEW and either the averaged measurement value CH1_AVE or the averaged measurement value CH2_AVE is accordingly selected as the selected measurement value SEL_VAL. In both cases, there is a jump to S192 and the process leaves the routine.

The check in S178 and S182 may each also be carried out on the basis of the second averaged measurement value CH2_AVE since both measurement values indicate an accordingly suitable current range.

A measurement accuracy which is better than +/−0.5% was able to be achieved in the entire predefined current measurement range and in the entire predefined temperature range by virtue of the measurement apparatus 20 described and the method described. The accuracy was likewise able to be achieved at low currents (for example +/−70 A), in particular. The measurement accuracy achieved can be compared with the accuracy which is stated in the data sheet for the used current sensor of the type DHAB S/133 from LEM and is stated as +/−1.5% for the first channel CH1 and +/−1.2% for the second channel CH2.

Such a measurement accuracy can be achieved more easily with a shunt via which the current of the line 12 from FIG. 1 flows, wherein the voltage drop through the electrical resistance of the shunt is measured in order to measure the current. However, at high currents, this measurement leads to a high electrical power loss and therefore possibly to heat problems and performance losses.

Various alterations and modifications are naturally possible within the scope of the present invention.

What is claimed:

1. A method for measuring a current (14) flowing through a conductor (12) using a measurement apparatus (20) having a current sensor (30) and at least one A/D converter (39), which current sensor (30) has at least two channels (CH1, CH2), via which channels (CH1, CH2) the current sensor (30) respectively provides a measurement signal (CH1_SIG, CH2_SIG) characterizing the current (14), which at least two channels (CH1, CH2) comprise a first channel (CH1) and a second channel (CH2), which second channel (CH2) is configured to measure a greater maximum current than the first channel (CH1), said method comprising the following steps:
A1) processing the measurement signal (CH1_SIG) from the first channel (CH1) in a first signal processing apparatus (40A) and generating a first averaged measurement value (CH1_AVE),
A2) processing the measurement signal (CH2_SIG) from the second channel (CH2) in a second signal processing apparatus (40B) and generating a second averaged measurement value (CH2_AVE),
carrying-out (i) low-pass filtering (41A; 41B) of the measurement signal (CH1_SIG; CH2_SIG) in the first signal processing apparatus (40A) and in the second signal processing apparatus (40B), and (ii) A/D conversion (42A; 42B) for generating digital individual measurement values (CH1_VAL; CH2_VAL),
comparing each of the individual measurement values (CH1_VAL; CH2_VAL) with predefined values,
generating a quality criterion (CH1_OOR; CH2_OOR) based upon the comparison,
averaging the individual measurement values (CH1_VAL; CH2_VAL) in order to generate an averaged measurement value (CH1_AVE; CH2_AVE),
B) selecting, in a selection apparatus (46), on the basis of the respective quality criterion (CH1_OOR; CH2_OOR), whether the first averaged measurement value (CH2_AVE) or the second averaged measurement value (CH2_AVE) is used as a selected measurement value (SEL_VAL).

2. The method as claimed in claim 1, correcting either the individual measurement values (CH1_VAL; CH2_VAL) or the averaged measurement values (CH1_AVE; CH2_AVE) using an associated correction function (44A, f_COR_CH1; 44B, f_COR_CH2) in the first signal processing apparatus (40A) and in the second signal processing apparatus (40B).

3. The method as claimed in claim 2, wherein the correction function (44A, f_COR_CH1; 44B, f_COR_CH2) is, in each case, dependent on the result of at least one sample measurement which is carried out with the associated channel (CH1; CH2) of the specifically used current sensor (30).

4. The method as claimed in claim 2, wherein the correction function (44A; 44B) comprises an offset and scaling.

5. The method as claimed in claim 1, further comprising selecting in the selection apparatus (46), on the basis of a level of the first averaged measurement value (CH1_AVE) or a level of the second averaged measurement value (CH2_AVE), whether the first averaged measurement value (CH1_AVE) or the second averaged measurement value (CH2_AVE) is used as the selected measurement value (SEL_VAL).

6. The method as claimed in claim 5,
wherein a transition from using the first averaged measurement value (CH1_AVE) as the selected measurement value (SEL_VAL) to using the second averaged measurement value (CH2_AVE) as the selected measurement value (SEL_VAL) takes place at a first limit measurement value (THRESHOLD_HIGH),
wherein a transition from using the second averaged measurement value (CH2_AVE) as the selected measurement value (SEL_VAL) to using the first averaged measurement value (CH1_AVE) as the selected measurement value (SEL_VAL) takes place at a second limit measurement value (THRESHOLD_LOW),
and wherein the first limit measurement value (THRESHOLD_HIGH) and the second limit measurement value (THRESHOLD_LOW) are different in order to cause hysteresis.

7. The method as claimed in claim 6, in which the first limit measurement value (THRESHOLD_HIGH) corresponds to a current (14) of a higher magnitude than the second limit measurement value (THRESHOLD_LOW).

8. The method as claimed in claim 1, wherein the measurement apparatus (20) has a temperature sensor (36), and the temperature sensor (36) is configured to determine a temperature measurement value (T_VAL) and the selected measurement value (SEL_VAL) is changed on the basis of a temperature compensation function (f_T_COMP) dependent on the temperature measurement value (T_VAL) in order to reduce an influence of the selected measurement value (SEL_VAL) that is dependent on the present temperature.

9. The method as claimed in claim 1, wherein the measurement apparatus (20) has an output apparatus (37; 52), and in which the selected measurement value (SEL_VAL) is output via the output apparatus (37; 52).

10. The method as claimed in claim 9, wherein the output apparatus is configured to output the selected measurement value (SEL_VAL) via a bus system, which bus system is in the form of a CAN bus, LIN bus, CAN-FD, FlexRay or Ethernet with BroadR-Reach.

11. The method as claimed in claim 1, wherein, the comparing step comprises carrying out a check in order to determine whether the respective individual measurement value (CH1_VAL; CH2_VAL) is greater, in terms of magnitude, than a predefined maximum value (CH1_MAX; CH2_MAX), and in which exceeding of the maximum value (CH1_MAX; CH2_MAX) for the quality criterion (CH1_OOR; CH2_OOR) is deemed to have a quality-reducing effect.

12. The method as claimed in claim 1, wherein, the comparing step comprises carrying out a check in order to determine whether the respective individual measurement value (CH1_VAL; CH2_VAL) is less, in terms of magnitude, than a predefined minimum value, and in which undershooting of the minimum value for the quality criterion (CH1_OOR; CH2_OOR) is deemed to have a quality-reducing effect.

13. The method as claimed in claim 1, in which the current sensor (30) is selected from the group consisting of:
    a direct-measurement current sensor, and
    a compensation current sensor.

14. The method as claimed in claim 1, wherein the current sensor is configured to measure a magnetic flux density generated by the current to be measured.

15. A measurement apparatus (20) having a current sensor (30) and at least one A/D converter, which current sensor (30) has at least two channels (CH1, CH2), via which channels (CH1, CH2) the current sensor (30) respectively provides a measurement signal (CH1_SIG, CH2_SIG) characterizing the current (14), which at least two channels (CH1, CH2) comprise a first channel (CH1) and a second channel (CH2), which second channel (CH2) is configured to measure a greater maximum current than the first channel (CH1), wherein the measurement apparatus is configured to:
A1) process the measurement signal (CH1_SIG) from the first channel (CH1) in a first signal processing apparatus (40A) and generate a first averaged measurement value (CH1_AVE),
A2) process the measurement signal (CH2_SIG) from the second channel (CH2) in a second signal processing apparatus (40B) and generate a second averaged measurement value (CH2_AVE),
carry-out (i) low-pass filtering (41A; 41B) of the measurement signal (CH1_SIG; CH2_SIG) in the first signal processing apparatus (40A) and in the second signal processing apparatus (40B), and (ii) A/D conversion (42A; 42B) for generating digital individual measurement values (CH1_VAL; CH2_VAL),
compare each of the individual measurement values (CH1_VAL; CH2_VAL) with predefined values,
generate a quality criterion (CH1_OOR; CH2_OOR) based on the comparison,
average the individual measurement values (CH1_VAL; CH2_VAL) in order to generate an averaged measurement value (CH1_AVE; CH2_AVE), and
B) select, in a selection apparatus (46), on the basis of the respective quality criterion (CH1_OOR; CH2_OOR), whether the first averaged measurement value (CH2_AVE) or the second averaged measurement value (CH2_AVE) is used as a selected measurement value (SEL_VAL).

* * * * *